(12) United States Patent
Pierce et al.

(10) Patent No.: US 12,476,205 B2
(45) Date of Patent: Nov. 18, 2025

(54) RECTILINEAR SEAMS BETWEEN ADJACENT FIELDS OF A DIE FOR IMPROVED LAYOUT EFFICIENCY

(71) Applicant: Intel Corporation, Santa Clara, CA (US)

(72) Inventors: Kimberly Pierce, Beaverton, OR (US); Marni Nabors, Hillsboro, OR (US); Mark Phillips, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 818 days.

(21) Appl. No.: 17/561,353

(22) Filed: Dec. 23, 2021

(65) Prior Publication Data
US 2023/0207491 A1 Jun. 29, 2023

(51) Int. Cl.
*H01L 23/58* (2006.01)
*H01L 21/768* (2006.01)
*H01L 23/528* (2006.01)
*H10D 84/00* (2025.01)
*G03F 7/20* (2006.01)

(52) U.S. Cl.
CPC .......... *H01L 23/585* (2013.01); *H01L 21/768* (2013.01); *H01L 23/528* (2013.01); *H10D 84/00* (2025.01); *G03F 7/2004* (2013.01)

(58) Field of Classification Search
CPC .. H01L 23/585; H01L 23/522; G03F 7/70475
USPC ......................................................... 257/14
See application file for complete search history.

(56) References Cited

U.S. PATENT DOCUMENTS

2019/0033706 A1* 1/2019 Yu .............................. G03F 1/70

* cited by examiner

*Primary Examiner* — Quoc D Hoang
(74) *Attorney, Agent, or Firm* — Essential Patents Group, LLP

(57) ABSTRACT

Devices, systems, and methods are described related to providing nonlinear lithographic seams, such as rectilinear lithographic seams, between adjacent fields of an integrated circuit die. Such nonlinear lithographic seams include lithographic enabling structures formed in co-planar layers with respect to functional structures in functional units of the fields of the integrated circuit die. Providing nonlinear lithographic seams improves layout efficiency of the functional units of the integrated circuit die.

24 Claims, 10 Drawing Sheets

RECTILINEAR SEAMS BETWEEN ADJACENT FIELDS OF A DIE FOR IMPROVED LAYOUT EFFICIENCY

BACKGROUND

As the integrated circuit industry continues to produce ever more advanced devices for use in various electronic products such as computers, servers, and portable products inclusive of portable computers, electronic tablets, cellular phones, digital cameras, and the like, there is a need to pattern smaller device features using photolithographic techniques. To push direct print patterning below 30 nm, pitch high numerical aperture extreme ultraviolet (high-NA EUV) lithography is likely to be required. The introduction of the high-NA anamorphic lens will reduce maximum field size (by half, for example) on layers patterned with this advanced EUV tooling. For example, this change may impact die-sizes greater than 26 mm×16.5 mm. However, large die products are also expected to be needed to support a variety of products, particularly those using large base die in multi-chip applications. Therefore, the die will need to be split such that it includes patterns from two or more lithographic fields to both utilize the discussed patterning capability and meet device requirements that necessitate die sizes larger than the patternable single lens field. The use of multiple lithographic fields on the same die provides a variety of difficulties, particularly at the seam between the fields within the active design.

It is with respect to these and other considerations that the present improvements have been needed. Such improvements may become critical as the need to provide smaller patterned feature sizes and larger dies having more complicated features using reticle stitching is necessary to support ever more sophisticated electronics systems and complexes.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
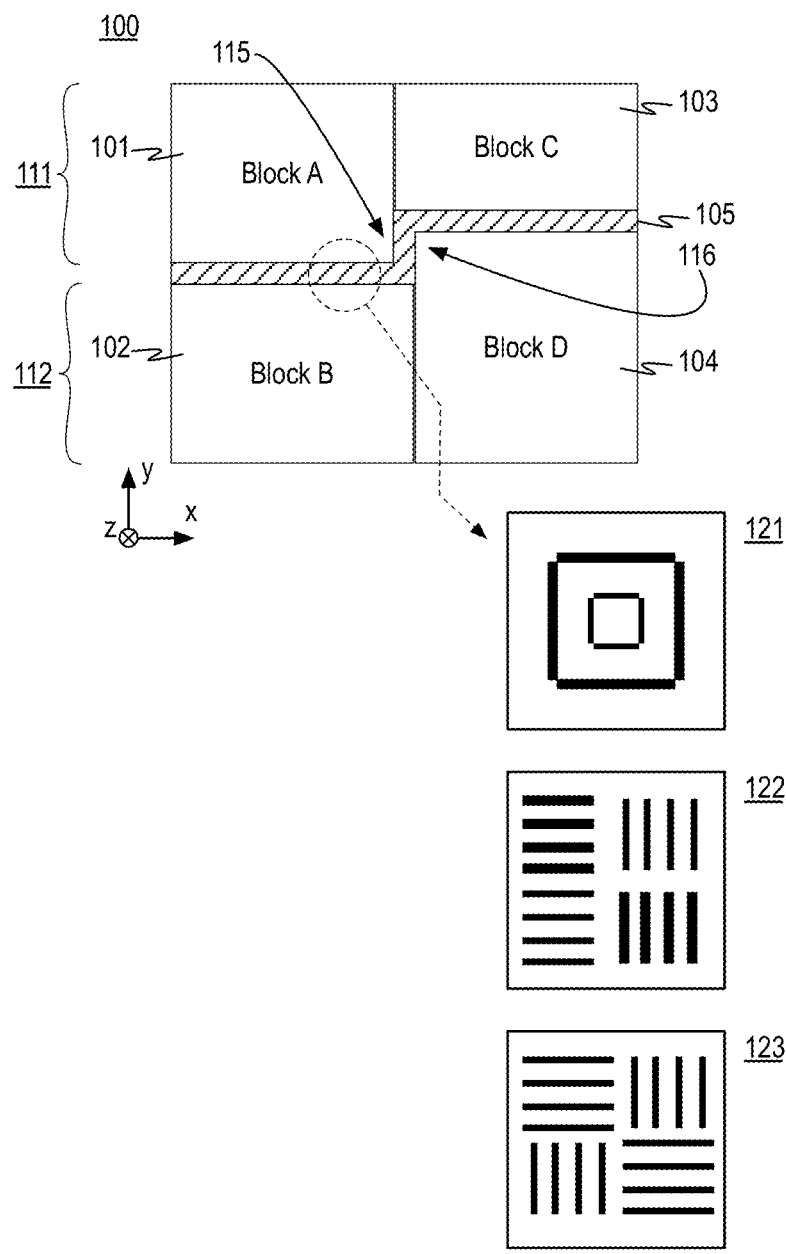
FIG. 1 illustrates a portion of an example monolithic integrated circuit die including functional units separated by a nonlinear lithographic seam.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. As used herein, the terms "monolithic", "monolithically integrated", and similar terms indicate the components of the monolithic overall structure form an indivisible whole not reasonably capable of being separated.

Integrated circuit dies, systems, and techniques are described herein related to providing a nonlinear lithographic seam between adjacent lithographic fields of a monolithic die to enable improved layout efficiency of functional units of the die.

As discussed, the introduction of advanced lithographic techniques leads to reduced lithographic field sizes in some contexts. As used herein, the term lithographic field indicates a region or area that is patterned in one exposure using the pertinent lithographic techniques. For example, for high numerical aperture extreme ultraviolet (high-NA EUV) exposures, particularly those using high-NA anamorphic lenses, the maximum field size is reduced by half relative to other lithographic techniques. For example, the maximum field size of high-NA EUV exposures, which may be needed to push direct printing feature patterns below 30 nm pitch, may be about 26 mm by 16.5 mm. However, advanced products also require larger die sizes such that each die requires multiple lithographic fields for those layers of the fabrication process that use small field sizes. Any number of multiple lithographic fields per die may be used such as two, four, or more. It is noted such multiple fields per die lithography is not necessarily needed for all layers of the fabrication process. Other layers may use one or fewer fields per die. For example, for those using high-NA EUV or other lithography techniques that require splitting a die into multiple fields, the nonlinear lithographic seams discussed herein may be deployed.

Notably, placing a linear lithographic seam between adjacent fields (e.g., at mask field splits) of a single die provides a challenge for design efficiency and layout ease of use. The techniques and structures discussed herein provide a nonlinear and rectilinear lithographic seam between adjacent fields for improved design efficiency and layout. As used herein, the term lithographic seam indicates a region of a layer of an integrated circuit (IC) die that includes lithographic assist features or structures and excludes active features or structures. For example, for a device layer, the active region of the IC die includes active device features or structures (e g , channel materials, source and drain material, gate electrode, gate contacts, source and drain contacts, etc.) while the lithographic seam includes inactive features or structures that are used for lithographic assist and/or other non-active purposes. For example, lithographic assist features or structures include registration marks, measurement features (e.g., metrology structures), and others. Other non-active purposes for such non-active or dummy features or structures include pattern fill and others.

The discussed lithographic seam may be at any layer or layers of the IC die that deploys the reduced field size lithography such as at device layers and lower metallization layers. As used herein, the term device layer includes any layer used to fabricate a device of the IC die such as a transistor, capacitor, or other active or passive device. The term metallization layer indicate a layer used to fabricate a via or metal line layer of the IC die. For example, advanced lithographic techniques that necessitate splitting a die into multiple fields may correspond to those layers having small features and/or tight pitches. Such patterning needs are typically found in some device layers and lower level metallization layers. As discussed herein, other layers may not need advanced lithographic techniques that necessitate die splitting into multiple fields. For such layers, the nonlinear lithographic field may be leveraged to deploy non-active features or the nonlinear lithographic field may be bypassed. For example, higher level metal lines may cross the lithographic seam in layers other than those where die splitting is used.

Deploying such rectilinear lithographic seams allows overlapping fields (i.e., die masks) and provides design flexibility to use a rectilinear lithographic seam boundary that improves functional unit layout and integration boundaries. As used herein, the term functional unit indicates a part of an IC die that is used as a monolithic part of the IC die to implement one or more known functions, to provide a capability for the IC die, or the like. Notably, a functional unit is provided within an area of the IC die. The rectilinear lithographic seams discussed herein may be characterized as a die mask zipper seam as the lithographic seam ties together fields of the die across a seam having a rectilinear shape (e.g., similar to a zipper pattern). As used herein, the term rectilinear indicates a shape made up linear runs and right angles, with a pattern similar to that of a Manhattan or taxicab route. It is noted that the term seam width or similar terms (e.g., width of a seam) is the distance across the linear portion of the seam while the term maximum distance across a nonlinear lithographic seam indicates a maximum width of the seam inclusive of the linear portions and any jogs in the seam.

FIG. 1 illustrates a portion of an example monolithic integrated circuit die 100 including functional units separated by a nonlinear lithographic seam, arranged in accordance with at least some implementations of the present disclosure. In FIG. 1, monolithic IC die 100 may extend in the x- and y-directions to any suitable size. The portion of monolithic IC die 100 includes two functional units 101, 103 (also labeled as blocks A, C) having one or more layers fabricated using a first lithographic field 111 and two functional units 102, 104 (also labeled as blocks B, D) having those same one or more layers fabricated using a second lithographic field 112. As shown, a nonlinear lithographic seam 105 separates functional units 101, 103 of lithographic field 111 and functional units 102, 104 of lithographic field 112. As shown, in some embodiments, functional units 101, 103, 102, 104 are substantially rectangular. In some embodiments, functional units 101, 103, 102, 104 are each abutted against nonlinear lithographic seam 105. Furthermore, particular ones of functional units 101, 103, 102, 104 (i.e., functional units 101, 104) are within the concave regions within aligned elbows 115, 116 of nonlinear lithographic seam 105. For example, elbows 115, 116 are aligned in a direction orthogonal to an extending direction of nonlinear lithographic seam 105.

IC die 100 may include any number of functional units such that a subset of such functional units, inclusive of functional units 101, 103, 102, 104 are abutted against nonlinear lithographic seam 105 such that functional units 101, 103, 102, 104 and nonlinear lithographic seam 105 share a boundary defined by nonlinear lithographic seam 105. Nonlinear lithographic seam 105 may contain additional elbows consistent with 115, 116 to support a bend in the seam between additional functional units.

As discussed, a lithographic field indicates an area or region exposed using a single lithographic exposure. For example, a photoresist layer for a layer of functional units 101, 103 is exposed with a single lithographic exposure using a corresponding reticle or mask. The same photoresist layer for the layer of functional units 102, 104 is then exposed with a different lithographic exposure using a corresponding different reticle or mask. The subsequent fabrication processing for the applicable layer (or layers) is then performed using the patterned photoresist as patterned with the two different fields and reticles to provide the layer of IC die 100 such that a layer includes a patterned material, a patterned impanation, or other feature. Such subsequent fabrication processing may use the patterned photoresist in any suitable context such as etching underlying layers to pattern them, to provide a trench or via for subsequent fill, providing an implant mask, and so on. Such fabrication operations are known in the art and are not discussed at length herein. Notably, the resultant processing uses the patterned photoresist to provide corresponding features (of a layer of IC die 100) as defined by the photoresist pattern.

In functional units 101, 103, 102, 104, such layers that deploy nonlinear lithographic seam 105 include functional features or structures therein. As used herein, the term functional feature or structure indicates a component or material that is deployed as part of the operable functional unit of IC die 100. The functional feature or structure may be a component of a transistor or other device, a via or metal line interconnecting devices, or the like. In contrast, non-functional features or structures are those that are not the operable functional unit of IC die 100. Such non-functional features or structures may have similar materials or dimensions but are not operable. Such non-functional features or structures may be deployed for pattern fill (i.e., so the wafer being fabricated has a more uniform surface) or as lithographic assist features or as dummy features.

For example, as shown in FIG. 1, for the layers that deploy nonlinear lithographic seam 105, nonlinear lithographic seam 105 includes non-functional structures such as lithographic assist features 121, 122, 123. In the illustrated embodiments, lithographic assist feature 121 is a registration mark having a number of concentric patterns such that a lithography tool may detect lithographic assist feature 121 in a subsequent lithographic patterning. For example, at the subsequent lithographic patterning the resist may be partially transparent such that lithographic assist feature 121 may be detected, its location mapped, and the resultant mapping of the wafer may be used to improve lithographic performance. Also as, shown, lithographic assist features, 122, 123 may include metrology or measurement patterns to verify the performance of the current lithographic operations. Such metrology or measurement patterns may be used after resist develop (e.g., measurements may be made using the patterned photoresist) and/or or the metrology or measurement patterns may be used after subsequent processing (e.g., metal lines or other features or components may be measured). In the illustrated example, lithographic assist features, 122, 123 include tight pitched horizontal and vertical line features. However, any lithographic assist features, 122, 123 may include any suitable metrology or measurement patterns such as isolated line features, tight pitched vias, isolated vias, other patterns, and so on.

As discussed, IC die 100 includes a number of first functional units 101, 103 in a first region or lithographic field 111 of IC die 100 and number of second functional units 102, 104 in a second region or lithographic field 112 of IC die 100. As discussed further herein, first functional units 101, 103 and second functional units 102, 104 include co-planar device layers and a number of co-planar metallization layers. As used herein, co-planar layers are layers that are aligned in the lateral plane (i.e., the x-y plane). The co-planar layers of functional units 101, 103, 102, 104 are formed in the same operations using the same resist layer, material layer(s), deposition process(es), etc. and are therefore co-planar. First region or lithographic field 111 and second region or lithographic field 112 are separated by nonlinear lithographic seam 105, which includes non-functional structures in the co-planar layers. Such non-functional structures are illustrated with respect to lithographic assist feature 121, 122, 123 and may include any non-functional features or structures discussed herein. Such non-functional features or structures are co-planar with the functional features or structures for the same reasons discussed above: they are formed in the same operations using the same resist layer, material layer(s), deposition process(es), etc. as those used to form the functional devices of functional units 101, 103, 102, 104.

IC die 100 includes a rectilinear nonlinear lithographic seam 105 (e.g., die mask zipper) to provide product floor plan flexibility in the layout of functional units 101, 103, 102, 104 for those layers using multiple lithographic fields and reticles without disrupting accepted lens field utilization (LFU), or lithographic field and reticle field size, at all other layers (e.g., those layers that do not require multiple fields per die). Rectilinear nonlinear lithographic seam 105 may maintain a minimal footprint to reduce waste in the layout. In some embodiments, for layers that require splitting a die into lithographic fields (e.g., for high-NA EUV layers), the design specification and validation of die 100 requires nonlinear lithographic seam 105 (e.g., a die mask zipper) to delineate where fields (and corresponding masks) are split within the design. In some embodiments, nonlinear lithographic seam 105 is a rectilinear region placed in accordance to the required process specification. For example, layers having nonlinear lithographic seam 105 may or may not be drawn by design such that, when not drawn by design, the relevant features or patterned in nonlinear lithographic seam 105 may be added during mask preparation.

It is noted that the layout of IC die, absent the requirement for multiple lithographic fields 111, 112, may place blocks A, B, C, D immediately adjacent one another. Such a layout is not possible with the limitation of multiple lithographic fields 111, 112 being necessary. In contrast to nonlinear lithographic seam 105, providing a linear seam immediately between blocks A and B and extending in the x-direction would require blocks C and D to be separated (wasting area) or keeping the abutted against the linear seam would provide difficulties and wasted area at other regions of IC die 100. In adding nonlinear lithographic seam 105, the dimension of the width of nonlinear lithographic seam 105 (e.g., in the y-dimension) is small compared to the cost of such wasted space due to a linear seam. Recovering wasted space to align block aspect ratios to a linear seam impacts design ease of use and potential re-use of blocks.

Figure 2:
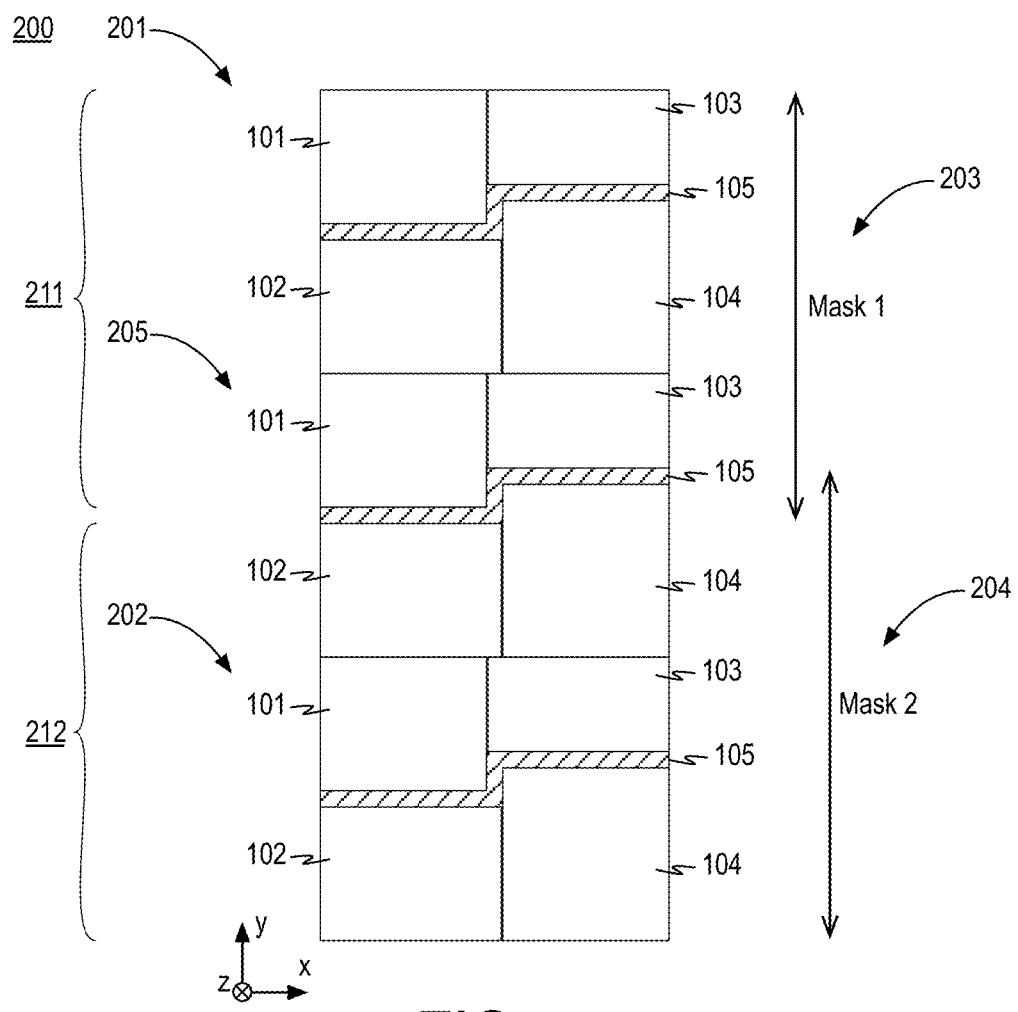
FIG. 2 illustrates a portion of an example monolithic integrated circuit die including repeating patterns of functional units separated by a nonlinear lithographic seam.

FIG. 2 illustrates a portion of an example monolithic integrated circuit die 200 including repeating patterns of functional units separated by a nonlinear lithographic seam, arranged in accordance with at least some implementations of the present disclosure. IC die 200 may have any characteristics discussed herein with respect to any other IC die discussed herein. In FIG. 2, monolithic IC die 200 may extend in the x- and y-directions to any suitable size. The illustrated portion of monolithic IC die 200 includes a repeating pattern of two functional units 101, 103 separated from two functional units 102, 104 by nonlinear lithographic seam 105. For example, functional units 101, 103, functional units 102, 104, and a portion of nonlinear lithographic seam 105 extending between the first and second subsets may make up a unit or region of IC die 200 and the unit or region is repeated orthogonal to the portion of nonlinear lithographic seam 105 (i.e., it is repeated in the y-direction) into the lithographic fields 212 of IC die 200.

Each of such regions 201, 205, 202 includes two functional units 101, 103, nonlinear lithographic seam 105, and two functional units 102, 104. As shown, two functional units 101, 103, nonlinear lithographic seam 105, and two functional units 102, 104 of region 201 and two functional units 101, 103 of region 205 are part of lithographic field 211 while two functional units 102, 104 of region 205 and two functional units 101, 103, nonlinear lithographic seam 105, and two functional units 102, 104 of region 202 are part of lithographic field 212.

As discussed, a photoresist layer is exposed with a single lithographic exposure using a corresponding reticle or mask to provide the pattern of lithographic field 211. The same photoresist layer is then exposed with a different lithographic exposure using a corresponding different reticle or mask to provide the pattern of lithographic field 212. Subsequent fabrication processing for the applicable layer (or layers) is then performed using the patterned photoresist as patterned with the two different fields and reticles. In functional units 101, 103, 102, 104, such layers that deploy nonlinear lithographic seams 105 include functional features or structures while nonlinear lithographic seams 105 include non-functional features or structures such as lithographic assist features, fill patterns, and so on.

Notably, FIG. 2 illustrates an exemplary incorporation of nonlinear lithographic seam 105 into a designed block such as an intellectual property (IP) block. As used herein, the terms designed block or IP block indicate a part of a die that performs any number of functions and may be repeated in IC die 200 to provide a known capability. For examples regions 201, 205, 202 may have substantially the same features or structures. In some embodiments, the functional features or structures in functional units 101, 103, 102, 104 are the same while the non-functional features or structures of nonlinear lithographic seams 105 may vary across regions 201, 205, 202. In some embodiments, the functional features or structures in functional units 101, 103, 102, 104 and the non-functional features or structures of nonlinear lithographic seams 105 are the same for each of regions 201, 205, 202.

For example, design control of nonlinear lithographic seams 105 may be provided to enable layers eligible for die splitting into multiple fields (e.g., for high-NA lithography mask splitting) on product floor plans. Such layers having nonlinear lithographic seams 105 may not be considered general global routing layers and instead functional features or structures may be maintained within functional units 101, 103, 102, 104. In some embodiments, minimal nonlinear lithographic seams 105 are used to provide lithographic field cut lines that can follow the edges of functional units 101, 103, 102, 104 without major layout pressure provides a limitation to how disruptive die splitting into multiple fields constraints will be in the design of IC die 200. As shown in FIG. 2, in some embodiments, designed blocks or IP blocks add nonlinear lithographic seams 105. Such added nonlinear lithographic seams 105 may be used for varied product configurations.

Also as shown in FIG. 2, lithographic field 211 may be patterned using a lithographic mask 203 (also labeled as mask 1) and lithographic field 212 may be patterned using a lithographic mask 204 (also labeled as mask 2). Lithographic masks 203, 204 may correspond to patterns from corresponding lithographic reticles (not shown) such as EUV reticles. Such masks further correspond to lithographic fields 111, 112 such that the masks 203, 204 provide the pattern being deployed in lithographic fields 111, 112.

Figure 3:
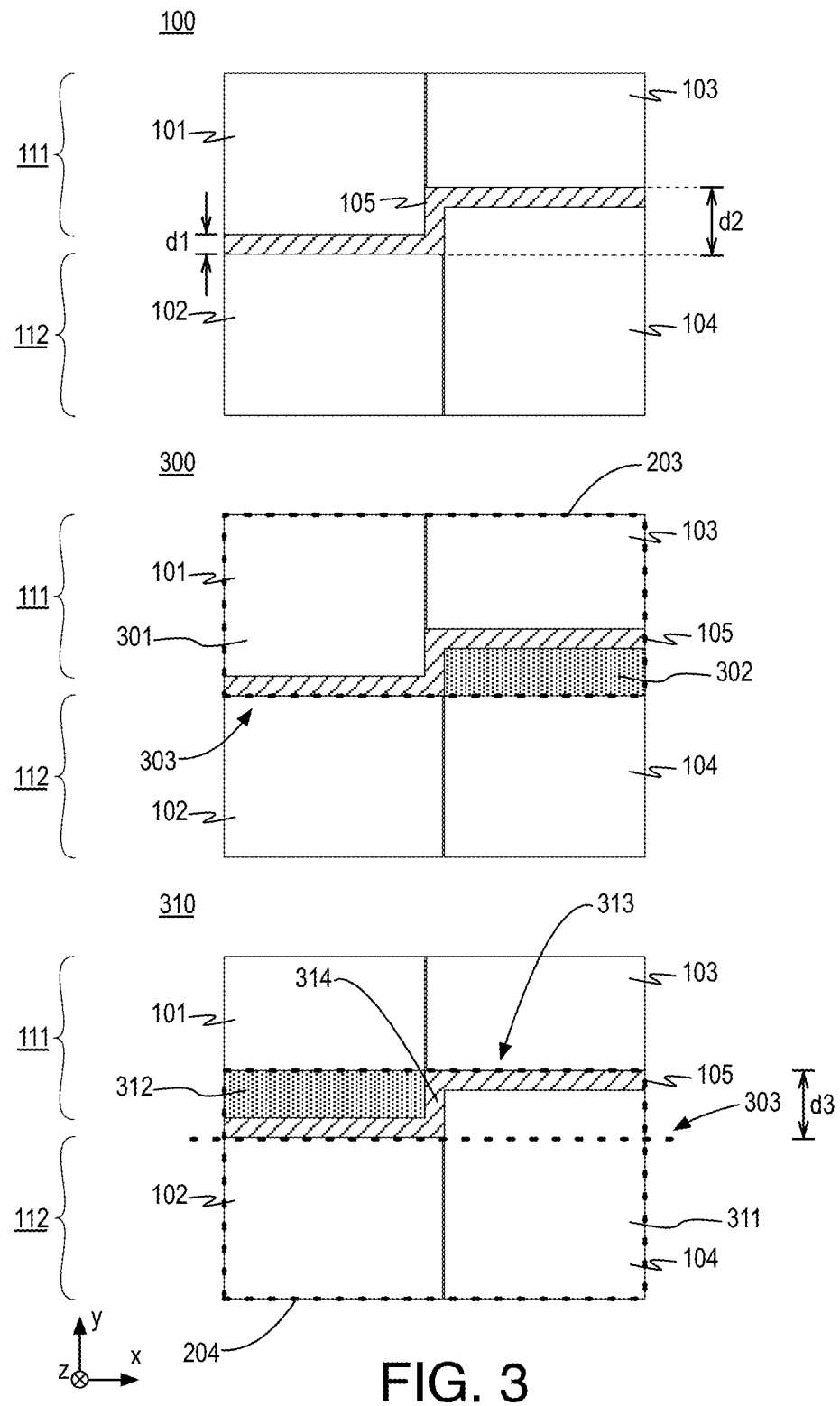
FIG. 3 illustrates exemplary lithographic field patterning for a layer of the monolithic integrated circuit die of FIG. 1.

FIG. 3 illustrates exemplary lithographic field patterning for a layer of monolithic integrated circuit die 100, arranged in accordance with at least some implementations of the present disclosure. As discussed with respect to FIG. 1, IC die 100 includes functional units 101, 103 separated from functional units 102, 104 by nonlinear lithographic seam 105. Nonlinear lithographic seam 105 may have any suitable seam width $d_1$ (i.e., the width across a linear portion of the seam). In some embodiments, seam width $d_1$ is not less than 10 microns. In some embodiments, seam width $d_1$ is not less than 100 microns. In some embodiments, seam width $d_1$ is in the range of 5 to 20 microns. In some embodiments, seam width $d_1$ is in the range of 20 to 100 microns. In some embodiments, seam width $d_1$ is in the range of 100 to 500 microns.

Furthermore, nonlinear lithographic seam 105 may have a maximum width $d_2$ that is defined as a maximum distance $d_2$ across nonlinear lithographic seam 105 in a direction orthogonal to adjoined edges of lithographic fields 111, 112. For example, at no position along the x-direction is the distance in the y-direction fully across nonlinear lithographic seam 105 greater than maximum distance d2. In some embodiments, maximum distance d2 is not more than 0.5 mm. In some embodiments, maximum distance d2 is not more than 0.25 mm. In some embodiments, maximum distance d2 in the range of 0.01 to 0.3 mm. In some embodiments, maximum distance d2 in the range of 0.1 to 0.5 mm. In some embodiments, maximum distance d2 in the range of 0.25 to 1.0 mm. Other maximum distances d2 may be used.

As shown in mask overlay 300, during a first exposure, lithographic mask 203 provides the patterning for functional units 101, 103 and, optionally, at least some inactive features or structures of nonlinear lithographic seam 105. For example, lithographic mask 203 provides a pattern for lithographic field 111 such that the pattern is exposed onto a photoresist layer and the photoresist layer is later developed to provide a patterned photoresist layer. The patterned photoresist layer is then used in fabrication as discussed herein. Lithographic mask 203 provides the patterning for functional features or structures of functional units 101, 103. As discussed, lithographic mask 203 may also provide patterning for non-functional features or structures of nonlinear lithographic seam 105. As shown, lithographic mask 203 has an edge 303 adjacent functional units 102, 104. Also as shown, lithographic mask 203 has an active patterning region 301 and a blank region 302 corresponding to a portion of functional unit 104 (e.g., blank region 302 corresponds to a portion of the active features of functional unit 104). As used herein, the term blank region indicates a region of a lithographic mask (and reticle) where no features are patterned. The term active patterning region indicates a region of a lithographic mask (and reticle) where features (active and inactive) are patterned.

Similarly, as shown in mask overlay 310, during a second exposure, lithographic mask 204 provides the patterning for functional units 102, 104 and, optionally, nonlinear lithographic seam 105. Notably, features or structures of nonlinear lithographic seam 105 may be patterned using one or both of lithographic mask 203 and lithographic mask 204. Lithographic mask 204 provides a pattern for lithographic field 112 such that the pattern is exposed onto the photoresist layer discussed with respect to mask overlay 300. The photoresist layer is developed to provide a patterned photoresist layer. The patterned photoresist layer as patterned by lithographic masks 203, 204 is then used in fabrication as discussed herein. Lithographic mask 204 provides the patterning for functional features or structures of functional units 102, 104. As discussed, lithographic mask 203 may also provide patterning for non-functional features or structures of nonlinear lithographic seam 105.

Lithographic mask 204 has an edge 313 adjacent functional units 101, 103. As shown with respect to overlay of edge 303 of lithographic mask 203, lithographic masks 203, 204 may overlap by a distance d3. In some embodiments, overlap distance d3 is not less than maximum width d2. However, in some embodiments, overlap distance d3 may be reduced when one of lithographic masks 203, 204 does not pattern inactive features in nonlinear lithographic seam 105. For example, if lithographic mask 203 does not pattern features in nonlinear lithographic seam 105, edge 303 may move in the positive y-direction and the overlap distance d3 may be reduced by seam width d1. Similarly, if inactive features are only to be patterned in orthogonal portion 314 of nonlinear lithographic seam 105 (e.g., the remainder of nonlinear lithographic seam 105 is to be left blank), edge 313 of lithographic mask 204 may be moved in the negative y-direction and the overlap distance d3 may be reduced by twice seam width d1. In some embodiments, lithographic masks 203, 204 (e.g., the lithographic fields provided thereby) overlap by a distance d3 not less than maximum width d2 across nonlinear lithographic seam 105. In some embodiments, lithographic masks 203, 204 overlap by a distance d3 that is the same as distance d2.

Also as shown, lithographic mask 204 has an active patterning region 311 and a blank region 312 corresponding to a portion of functional unit 101 (e.g., blank region 312 corresponds to a portion of the active features of functional unit 101). Notably, for patterning reliability, active features of each of functional units 101, 103, 102, 104 may be patterned by the same lithographic mask (e.g., lithographic mask 203 patterns the entirety of functional units 101, 103 and lithographic mask 204 patterns the entirety of functional units 102, 104). For example, the lithographic mask characteristics discussed with respect to lithographic masks 203, 204 provides a mask split to fully enclose nonlinear lithographic seam 105 with no active device content overlaps and each of lithographic masks 203, 204 bound by the edges of lithographic fields 111, 112 and nonlinear lithographic seam 105.

Figure 4:
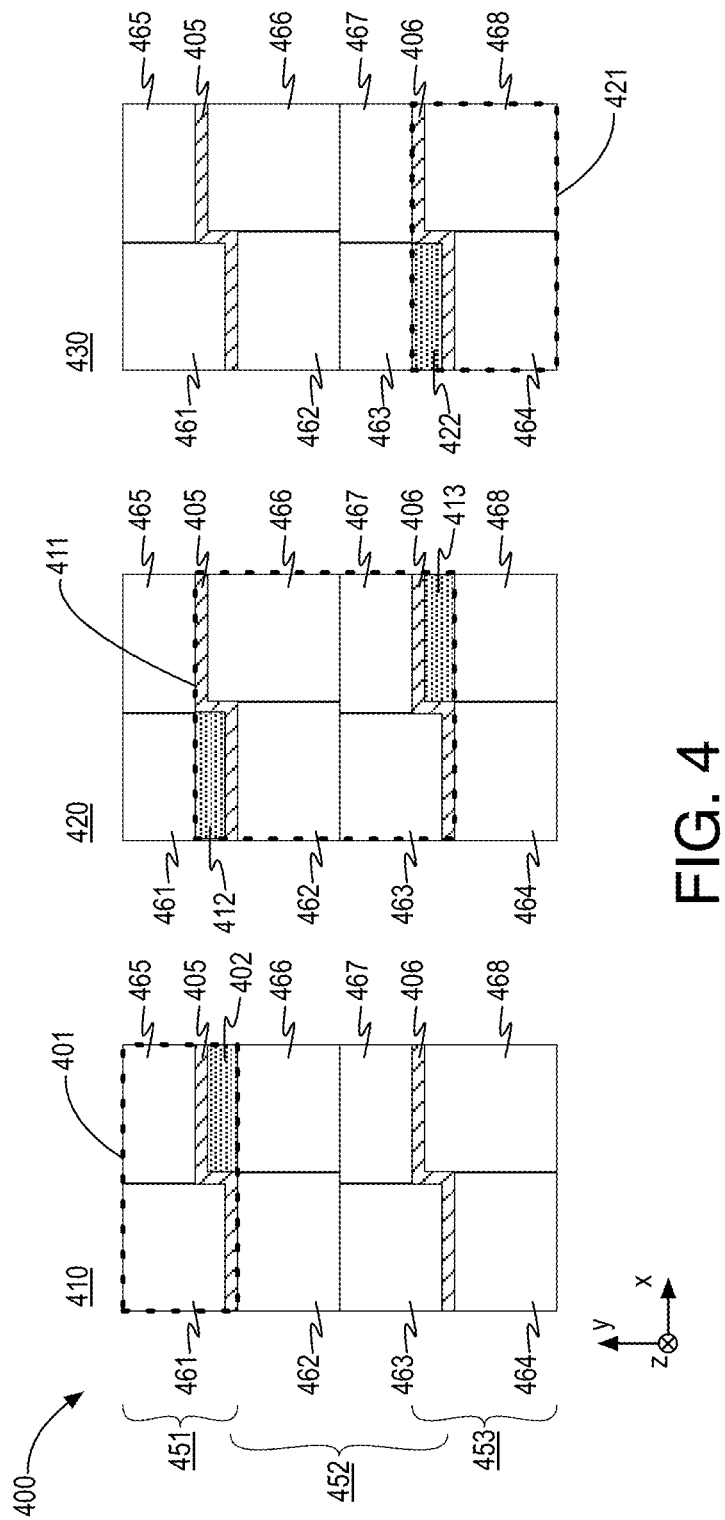
FIG. 4 illustrates exemplary extension of lithographic field patterning for a layer of a monolithic integrated circuit die.

FIG. 4 illustrates exemplary extension of lithographic field patterning for a layer of a monolithic integrated circuit die, arranged in accordance with at least some implementations of the present disclosure. As shown in FIG. 4, IC die 400, which may have any characteristics discussed with respect to with respect to any other IC die discussed herein. IC die 400, for example, includes multiple nonlinear lithographic seams 405, 406. Nonlinear lithographic seam 405 separates functional units 461, 465 from functional units 462, 466 and nonlinear lithographic seam 406 separates functional units 463, 467 from functional units 464, 468. Such functional units and nonlinear lithographic seams may have any characteristics discussed with respect to functional units 101, 103, 102, 104 and nonlinear lithographic seam 105.

As shown in mask overlay 410, during a first exposure, lithographic mask 401 provides the patterning for functional units 461, 465 and, optionally, at least some inactive features or structures of nonlinear lithographic seam 405. For example, lithographic mask 401 provides a pattern for lithographic field 451 such that the pattern is exposed onto a photoresist layer. Lithographic mask 401 provides the patterning for functional features or structures of functional units 461, 465 and, optionally for non-functional features or structures of nonlinear lithographic seam 405. In FIG. 4, the edges and overlaps of adjacent lithographic masks 401, 411, 421 may have any characteristics as discussed with respect to lithographic masks 203, 204. As shown, lithographic mask 401 has a blank region 402 corresponding to a portion of functional unit 466 (e.g., blank region 402 corresponds to a portion of the active features of functional unit 466) such that no features are patterned by lithographic mask 401 in functional unit 466.

Similarly, as shown in mask overlay 420, during a second exposure, lithographic mask 411 provides the patterning for functional units 462, 463, 466, 467 and, optionally, at least some inactive features or structures of nonlinear lithographic seam 405 and/or nonlinear lithographic seam 406. Notably, features or structures of nonlinear lithographic seam 405 may be patterned using one or both of lithographic mask 401 and lithographic mask 411. Lithographic mask 411 provides a pattern for lithographic field 452 such that the pattern is exposed onto the discussed photoresist layer for eventual develop processing. As shown, lithographic mask 411 has blank regions 412, 413 corresponding to portions of functional units 461, 468, respectively, such that no features are patterned by lithographic mask 411 in functional units 461, 468.

Furthermore, as shown in mask overlay 430, during a third exposure, lithographic mask 421 provides the patterning for functional units 464, 468 and, optionally, at least some inactive features or structures of nonlinear lithographic seam 406. Notably, features or structures of nonlinear lithographic seam 406 may be patterned using one or both of lithographic mask 411 and lithographic mask 421. Lithographic mask 421 provides a pattern for lithographic field 453 such that the pattern is exposed onto the discussed photoresist layer. The exposed photoresist layer is then developed to provide a patterned photoresist layer. The patterned photoresist layer as patterned by lithographic masks 401, 411, 421 is then used in fabrication as discussed herein. As shown, lithographic mask 421 has a blank regions 422 corresponding to a portion of functional unit 463 such that no features are patterned by lithographic mask 421 in functional unit 463. Any number of such lithographic operations may be performed to fabricate a layer of an IC die.

Figure 5:
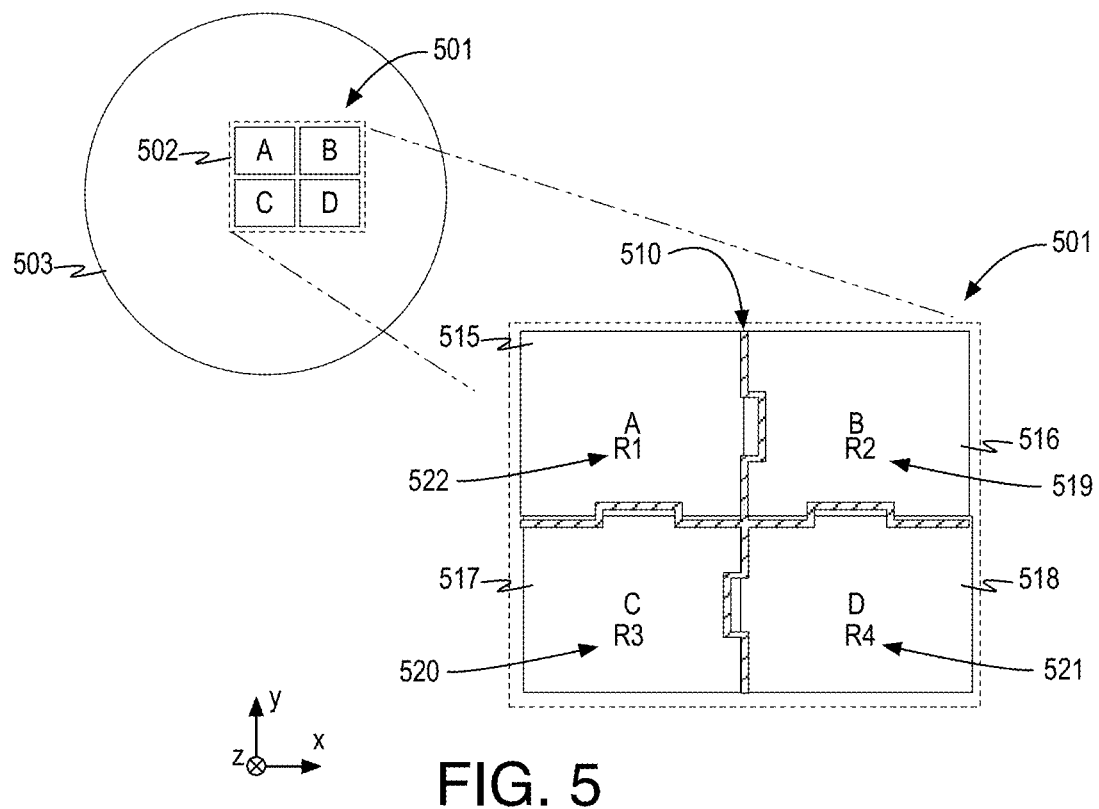
FIG. 5 illustrates an example monolithic integrated circuit die including functional units separated by a nonlinear lithographic seam as processed on a substrate wafer.

FIG. 5 illustrates an example monolithic integrated circuit die 501 including functional units separated by a nonlinear lithographic seam as processed on a substrate wafer, arranged in accordance with at least some implementations of the present disclosure. As shown, IC die 501 may be singulated from substrate wafer 503 using scribe cuts 502 that surround IC die 501 but do not intersect between fields 515, 516, 517, 518 (also labeled as A, B, C, D) of IC die 501 such that fields 515, 516, 517, 518 correspond to areas or regions patterned using separate lithography exposures. IC die 501 may have any characteristics discussed with respect to any other IC die herein. Fields 515, 516, 517, 518 may also be characterized as regions or tiles.

One or more layers of fields 515, 516, 517, 518 are patterned in separate lithography exposures that pattern nonlinear lithographic seams 510 as discussed herein. For such layers, fields 515, 516, 517, 518 are patterned using separate reticles 522, 519, 520, 521. Other layers of IC die 501 may be patterned using one or fewer reticles. For example, for layers that do not require high-NA EUV patterning, a single reticle and lithographic field may be used. In such layers, nonlinear lithographic seams 510 may be handled by not placing active features therein, placing inactive features therein, or placing active features therein. For example, as discussed further herein below, such layers may include metal lines that pass over nonlinear lithographic seams 510.

Figure 6:
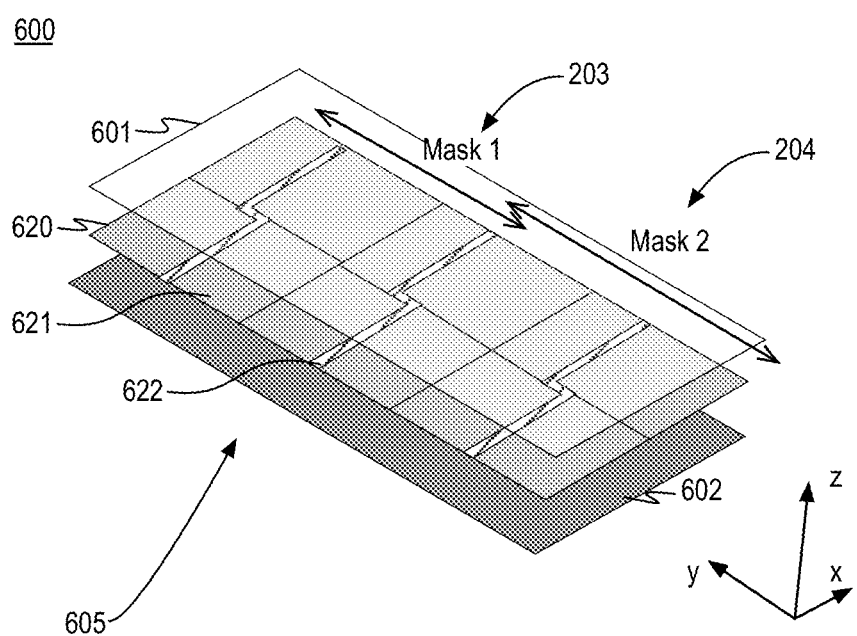
FIG. 6 illustrates a multilayer stack of an example monolithic integrated circuit die including lower and upper layers having a single lithographic field and a multi-lithographic field layer therebetween.

FIG. 6 illustrates a multilayer stack 600 of an example monolithic IC die 605 including lower and upper layers having a single lithographic field and a multi-lithographic field layer therebetween, arranged in accordance with at least some implementations of the present disclosure. In the example of FIG. 6, a split field device layer or metallization layer 620 has functional units 621 separated by nonlinear lithographic seams 622 such that some of functional units 621 are defined by lithographic mask 203 and other of functional units 621 are defined by lithographic mask 204, as discussed herein.

Furthermore, multilayer stack 600 illustrates that a layer 602 below split field device layer or metallization layer 620 and/or a layer 601 above split field device layer or metallization layer 620 may not have split fields. For example, split field device layer or metallization layer 620 of IC die 605 is formed using two lithographic fields as discussed herein. In contrast, layers 602, 601 are fabricated using a single lithographic field for the entirety of IC die 605.

Split field device layer or metallization layer 620 may be deployed at any layer of IC die 605 such as one or more device layer(s) and one or more metallization layer(s). As discussed, a device layer is any layer used to fabricate a device of IC die 605 and a metallization layer is a via or metal line layer of IC die 605 used to interconnect the devices and/or provide routing to an external interface of IC die 605. In some embodiments, split field device layer or metallization layer 620 is used at the lowest metallization layer or layers of IC die 605 such M1 and M2, for example. The techniques discussed herein, using nonlinear lithographic seam 105 (e.g., die mask zippers) allow other layers that have been optimized for the lens field utilization (LFU) and reticle area to be unchanged when patterned on tooling with a different optimization metric relative to those used for split field device layer or metallization layer 620.

Figure 7:
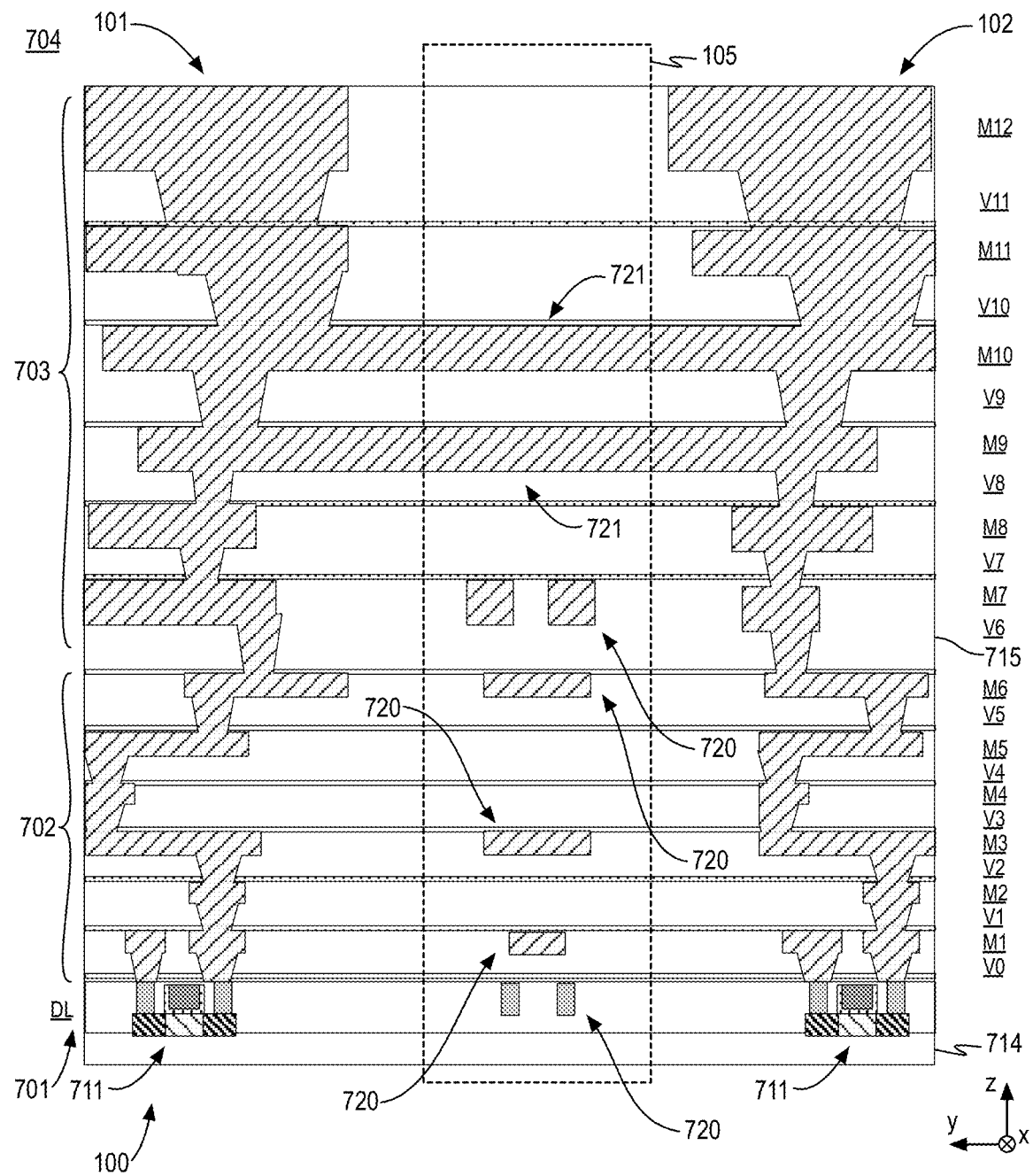
FIG. 7 provides a cross-sectional view of an exemplary portion of the monolithic integrated circuit die of FIG. 1 taken across a nonlinear lithographic seam.

FIG. 7 provides a cross-sectional view of an exemplary portion 704 of IC die 100 taken across nonlinear lithographic seam 105, arranged in accordance with at least some implementations of the present disclosure. For example, with reference to FIG. 1, the cross-sectional view is taken in the y-dimension extending from functional unit 101 to functional unit 102 and across nonlinear lithographic seam 105, looking in the positive x-direction. Notably, some layers of IC die 100 are fabricated using separate lithographic fields 111, 112 while others are fabricated using a lithographic field that encompasses the entirety of IC die 100.

As shown, IC die 100 includes a substrate 714, having a lateral surface along the x-y plane. Substrate 714 may be any material known to be suitable for the fabrication of device circuitry. For example, substrate 714 may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. In the illustrated example, planar transistors 711 are formed on and/or within substrate 714 such that planar transistors 711 are part of a device layer 701. Device layer may include any active devices such as transistors (planar or multi-gate), memory devices, capacitors, resistors, optoelectronic devices, or switches.

Transistors 711 interconnection, routing to an outside device (not shown), routing within IC die 100, routing through IC die 100, etc. is provided by metallization layers 702, 703. Transistors 711 and metallization layers 702, 703 are embedded within dielectric materials 715. Metallization layers 702, 703 include lower level metallization layers 702 and higher level metallization layers 703. In the illustrated example, lower level metallization layers 702 include V0-M6 and higher level metallization layers 703 include V6-M12, however any such metallization layers may be deployed. In some embodiments, lower level metallization layers 702 are subject to field splitting while higher level metallization layers 703 are not. However, any combination of field splitting layers may be used.

As shown, for those layers using field splitting, non-functional features structures 720 (such as lithographic assist features 121, 122, 123) may be deployed in nonlinear lithographic seam 105. Such non-functional structures 720 are illustrated in DL, M1, M3, M6, M7, but they may be used in any of device layer 701, lower level metallization layers 702, and higher level metallization layers 703. Furthermore, in layers where a single lithographic field encompasses IC die 100, metallization lines 721 (or other functional structures or features) may be provided in the area of those layers used for nonlinear lithographic seam 105. For example, in such layers nonlinear lithographic seam 105 may deploy active features.

Each of device layer 701, lower level metallization layers 702, and higher level metallization layers 703 are co-planar as discussed herein. IC die 100 includes a co-planar device layer 701 and co-planar metallization layers 702, 703 such that one or more of co-planar device layer 701 and/or co-planar metallization layers 702, 703 include non-functional structures 720 (e.g., DL, M1, M3, M6, M7, or others). The one or more of co-planar device layer 701 and/or co-planar metallization layers 702, 703 including non-functional structures 720 also include active features of functional units 101, 102. As discussed, other co-planar layers of IC die 100 other than the one or more of co-planar device layer 701 and/or co-planar metallization layers 702, 703 including non-functional structures 720 may be fabricated using a lithographic field that encompasses the entirety of IC die 100. In some embodiments, a second co-planar metallization layers 702, 703 (e.g., M9, M10, or others) includes a metal line such as one of metallization lines 721 extending over nonlinear lithographic seam 105 and between functional units 101, 102. Such metal lines may be allowed or disallowed in the design of an IC die.

Figure 8:
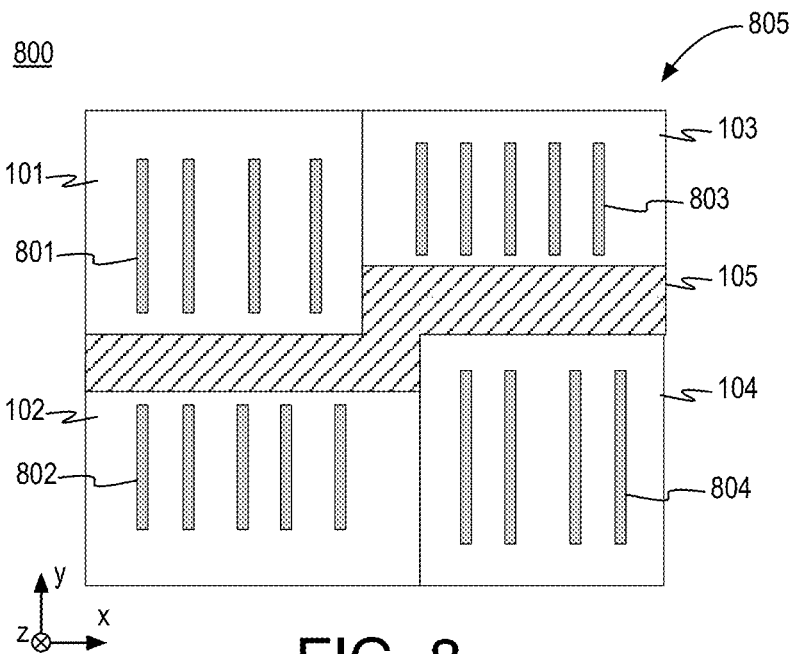
FIG. 8 illustrates an example metal layer of a monolithic integrated circuit die where no metal lines are allowed in a nonlinear lithographic seam.

FIG. 8 illustrates an example metal layer of a monolithic integrated circuit die 800 where no active metal lines are allowed in nonlinear lithographic seam 105, arranged in accordance with at least some implementations of the present disclosure. IC die 800 may have any characteristics discussed with respect to any other IC dies discussed herein. As shown, metallization layer 805 of IC die 800 may include metal lines 801 in functional unit 101, metal lines 802 in functional unit 102, metal lines 803 in functional unit 103, and metal lines 804 in functional unit 104 such that none of metal lines 801, 802, 803, 804 are allowed to cross the area of nonlinear lithographic seam 105.

In the example of FIG. 8, metallization layer 805 of IC die 800 may be fabricated using a single field for IC die 800 or lithographic field splitting. In either case, design rules may be applied for metallization layer 805 (e.g., any of M1-M12) such that no functional metal lines may be deployed in the region of nonlinear lithographic seam 105.

Figure 9:
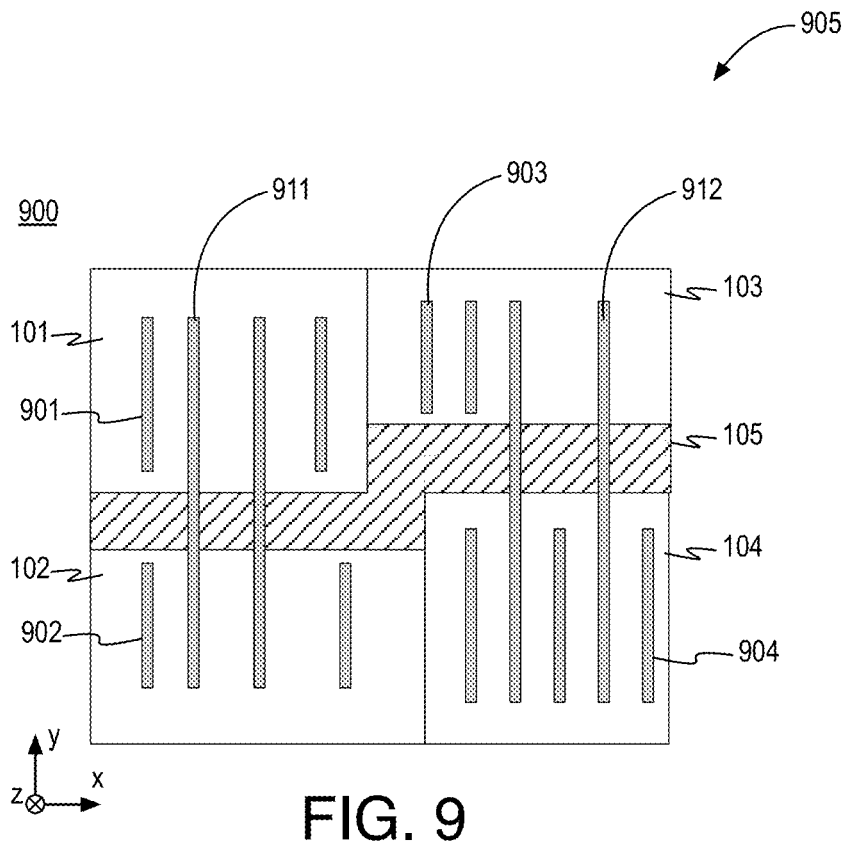
FIG. 9 illustrates an example metal layer of a monolithic integrated circuit die where metal lines are allowed to cross a nonlinear lithographic seam.

FIG. 9 illustrates an example metal layer of a monolithic integrated circuit die 900 where active metal lines are allowed to cross nonlinear lithographic seam 105, arranged in accordance with at least some implementations of the present disclosure. IC die 900 may have any characteristics discussed with respect to any other IC dies discussed herein. As shown, metallization layer 905 of IC die 900 include metal lines 901 contained in functional unit 101, metal lines 902 contained in functional unit 102, metal lines 903 contained in functional unit 103, and metal lines 904 contained in functional unit 104 such that none of such metal lines 901, 902, 903, 904 cross the area of nonlinear lithographic seam 105.

Metallization layer 905 of IC die 900 further includes metal lines 911 that extend from functional unit 101 to functional unit 102 across the area of nonlinear lithographic seam 105 and metal lines 912 that extend from functional unit 103 to functional unit 104 across the area of nonlinear lithographic seam 105. For example, metallization layer 905 may be fabricated using a single field for IC die 900 or lithographic field splitting. In such examples, metal lines 911, 912 crossing nonlinear lithographic seam 105 may be provided to provide further integration of IC die 900.

Such metal lines 911, 912 crossing nonlinear lithographic seam 105 may be subject to design rules inclusive of rules restricting the widths of metal lines 911, 912, rules restricting the pitches of metal lines 911, 912, rules restricting the number or size of jogs in metal lines 911, 912 (or disallowing jogs in or near nonlinear lithographic seam 105). In some embodiments, metal lines 911, 912 of metallization layer 905 may be allowed in nonlinear lithographic seam 105 but no vias (above or below metal lines 911, 912) may couple to metal lines 911, 912 in nonlinear lithographic seam 105. Other design rules or limitations may be applied.

Figure 10:
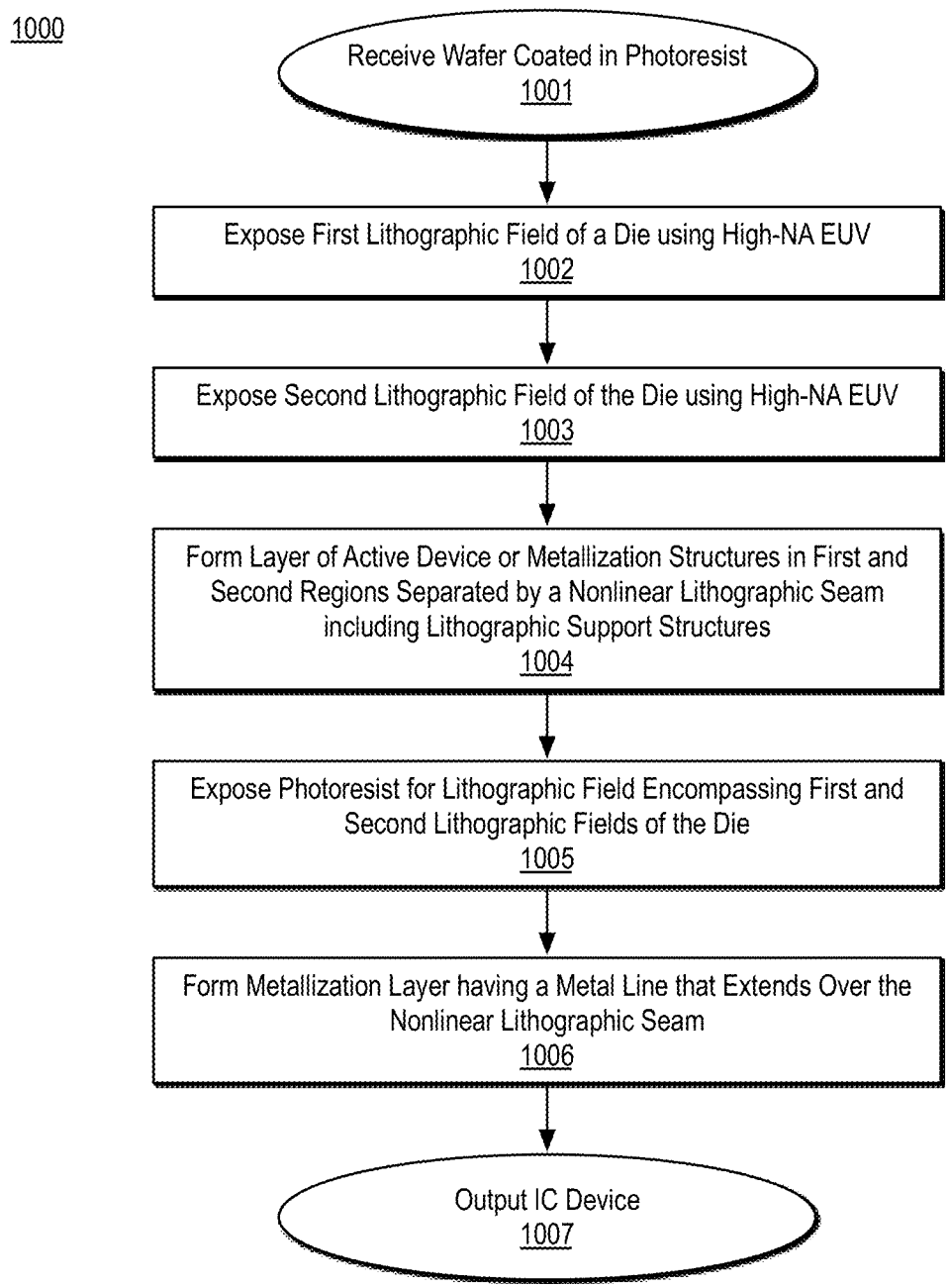
FIG. 10 is a flow diagram illustrating an example process for fabricating an integrated circuit device having a nonlinear lithographic seam in one or more layers thereof.

FIG. 10 is a flow diagram illustrating an example process 1000 for fabricating an integrated circuit device having a nonlinear lithographic seam in one or more layers thereof, arranged in accordance with at least some implementations of the present disclosure. For example, process 1000 may be implemented to fabricate any IC dies or device structures discussed herein.

Process 1000 begins at operation 1001, where a wafer coated in photoresist is received for processing. The wafer may include any suitable substrate material. For example, the substrate may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. The received wafer may be partially fabricated to include a portion of a device layer already formed or an entirety of a device layer and metallization layers already formed. For example, the received wafer may be received for device layer processing, metal line layer processing, via layer processing, and so on such that the pertinent layer being fabricated is to be fabricated with die splitting into multiple lithographic fields. The device layer being fabricated or previously fabricated may include transistors, memory devices, capacitors, resistors, optoelectronic devices, switches, or any other active or passive electronic devices, or portions thereof. The metallization layer(s) may include via layers and metal line layers to interconnect and provide access to the devices. The wafer is coated with a photoresist layer for patterning operations such that the photoresist layer may include any suitable photoresist material.

Processing continues at operation 1002, where a first lithographic field of the substrate is exposed using a first lithographic mask. For example, the first lithographic field corresponds to a split field of a monolithic IC die to be segmented from the wafer. For example, process 1000 includes exposing a first lithographic field of a photoresist layer over a die. In some embodiments, the exposure at operation 1002 is a high numerical aperture extreme ultraviolet exposure. In some embodiments, the first exposure is performed to provide a lithographic field as discussed with respect to FIGS. 3 and 4. Such patterning of the first lithographic field provides active features or structures for functional units of the first lithographic field. In some embodiments, functional units of the first lithographic field are rectangular functional units.

Processing continues at operation 1003, where a second lithographic field of the substrate is exposed using a second lithographic mask such that the second lithographic field is immediately adjacent the first lithographic field. For example, the second lithographic field corresponds to a second split field of the monolithic IC die to be segmented from the wafer. For example, process 1000 includes exposing a second lithographic field of the photoresist layer over the die. In some embodiments, the exposure at operation 1002 is a high numerical aperture extreme ultraviolet exposure. In some embodiments, the first exposure is performed to provide a lithographic field as discussed with respect to FIGS. 3 and 4. Such patterning of the second lithographic field provides active features or structures for functional units of the second lithographic field. In some embodiments, functional units of the second lithographic field are rectangular functional units.

As discussed, such patterned first and second lithographic fields pattern a nonlinear lithographic seam (e.g., die mask zipper) at the overlap between the patterned fields. The overlap may be any suitable distance such as distance not less than a maximum distance across the nonlinear lithographic seam. Such patterning of the nonlinear lithographic seam patterns non-functional features or structures inclusive of lithographic registration marks and metrology structures. In some embodiments, the first lithographic field (patterned at operation 1002) includes a blank region corresponding to a portion of the active features of the functional units in the second lithographic field. Similarly, the second lithographic field (patterned at operation 1003) may include a blank region corresponding to a portion of the active features of the functional units in the first lithographic field.

Such processing operations may be performed any number of times to pattern the photoresist layer over the die. In some embodiments, two lithographic fields are used; however, any number of lithographic fields per die may be deployed such as 4, 6, or 8 fields per die. In some embodiments, process 1000 includes exposing a third lithographic field of the photoresist layer adjacent the second lithographic field such that a second nonlinear lithographic seam is patterned between the second and third regions.

Processing continues at operation 1004, where a layer of one of device structures or metallization structures are formed in first and second regions of the die using the exposed first and second lithographic fields of the photoresist layer. For example, the layer (e.g., a device material layer, a via metallization layer, a metal line metallization layer, etc.) is fabricated using the patterned photoresist layer such that the fabricated regions correspond to the exposed first and second lithographic fields. In some embodiments, the first region includes first rectangular functional units of the device structures or metallization structures and the second region includes second rectangular functional units of the device structures or metallization structures. Furthermore, the layer further includes a nonlinear lithographic seam between the first and second regions such that the nonlinear lithographic seam includes non-functional features of lithographic registration marks and/or metrology structures patterned during the exposure of the first or second lithographic fields. For example, any layer of an IC die such as a device layer or metallization layer (refer to FIG. 7) may be fabricated using operations 1002-1004.

Processing continues at operation 1005, where lithography exposure is performed for another layer of the IC die being fabricated. For example, after additional processing a second photoresist layer is provided over the wafer including the IC die being fabricated. At operation 1005, the exposure encompasses the first and second lithographic fields exposed at operations 1002, 1003 and, optionally encompasses the entirety of the IC die to be segmented from the wafer. For example, the lithographic exposure at operation 1005 exposes a third lithographic field of a second photoresist layer over the die such that the third lithographic field includes the areas of the first and second lithographic fields patterned at operations 1002, 1003, respectively.

Processing continues at operation 1006, where a higher layer of the IC die is fabricated. In the illustrated example, the higher layer is a metallization layer having a metal line that extends over the lithographic seam formed at operation 1004. For example, a metallization layer having a metal line (refer to FIG. 7) that extends over the lithographic seam may be formed using metallization techniques such as transferring the pattern of the patterned photoresist to an underlying dielectric layer and performing metal fill and optional planarization. In other examples, the fabrication at operation 1006 provides any device or metallization layer having a larger lithographic field size than the patterning at operations 1002, 1003. Furthermore, although discussed with respect to such patterning being for a higher layer in the IC die, such techniques may be deployed at lower levels or both lower and higher levels in the fabrication stack.

Processing continues at operation 1007, where an integrated circuit device including a nonlinear lithographic seam is output. For example, a die including multiple lithographic fields in one or more nonlinear lithographic seam layers (and single fields in other layers) may be segmented from a remainder of the substrate (i.e., substrate wafer), packaged, and so on, and eventually included in an electronic device.

Exemplary devices and systems are discussed herein below. In some embodiments, a system includes a first die including memory circuitry, a second die including logic circuitry, and a power supply coupled to the first and/or second dies, the first or second die including first functional units in a first region of the first or second die, second functional units in a second region of the first or second die such that the first and second functional units include co-planar device layer and a number of co-planar metallization layers, and a nonlinear lithographic seam between the first and second functional units. Such functional units and the nonlinear lithographic seam may have any characteristics discussed herein. For example, a rectilinear lithographic seam may include a first elbow and a second elbow aligned with the first elbow, with one of the first functional units within the first elbow and one of the second functional units within the second elbow.

Figure 11:
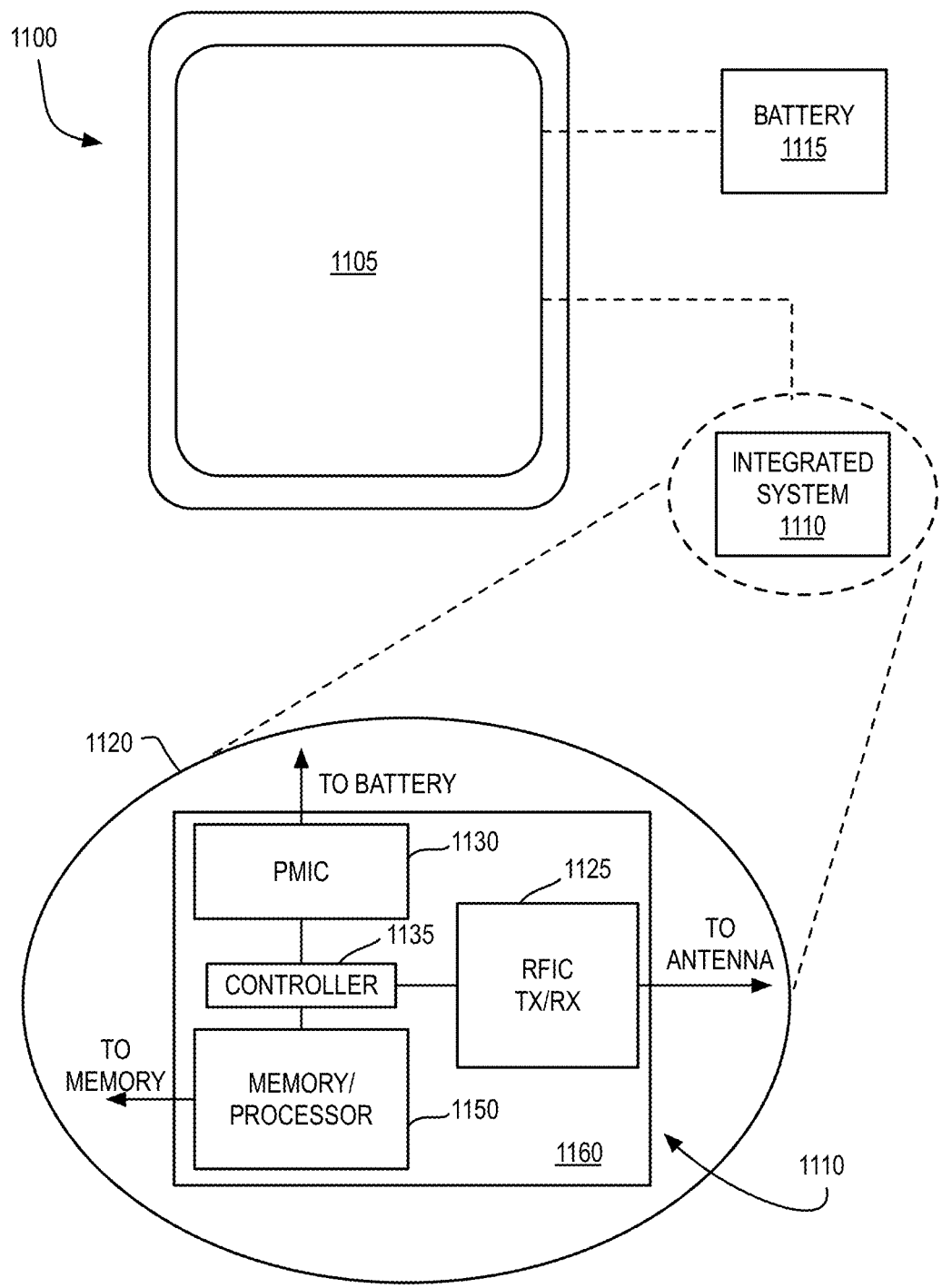
FIG. 11 is an illustrative diagram of a mobile computing platform employing an integrated circuit die having a nonlinear lithographic seam separating fields of the integrated circuit die.

FIG. 11 is an illustrative diagram of a mobile computing platform 1100 employing an integrated circuit die having a nonlinear lithographic seam separating fields of the integrated circuit die, arranged in accordance with at least some implementations of the present disclosure.

Any device or structure having any components, materials, or characteristics discussed herein may be implemented by any component of mobile computing platform 1100. Mobile computing platform 1100 may be any portable device configured for each of electronic data display, electronic data processing, wireless electronic data transmission, or the like. For example, mobile computing platform 1100 may be any of a tablet, a smart phone, a netbook, a laptop computer, etc. and may include a display screen 1105, which in the exemplary embodiment is a touchscreen (e.g., capacitive, inductive, resistive, etc. touchscreen), a chip-level (system on chip—SoC) or package-level integrated system 1110, and a battery 1115. Battery 1115 may include any suitable device for providing electrical power such as a device consisting of one or more electrochemical cells and electrodes to couple to an outside device. Mobile computing platform 1100 may further include a power supply to convert a source power from a source voltage to one or more voltages employed by other devices of mobile computing platform 1100.

Integrated system 1110 is further illustrated in the expanded view 1120. In the exemplary embodiment, packaged device 1150 (labeled "Memory/Processor" in FIG. 11) includes at least one memory chip (e.g., RAM), and/or at least one processor chip (e.g., a microprocessor, a multi-core microprocessor, or graphics processor, or the like). In an embodiment, the package device 1150 is a microprocessor including an SRAM cache memory. As shown, device 1150 may employ a die or device having any transistor structures and/or related characteristics discussed herein. Packaged device 1150 may be further coupled to (e.g., communicatively coupled to) a board, a substrate, or an interposer 1160 along with, one or more of a power management integrated circuit (PMIC) 1130, RF (wireless) integrated circuit (RFIC) 1125 including a wideband RF (wireless) transmitter and/or receiver (TX/RX) (e.g., including a digital baseband and an analog front end module further comprises a power amplifier on a transmit path and a low noise amplifier on a receive path), and a controller 1135 thereof. In general, packaged device 1150 may be also be coupled to (e.g., communicatively coupled to) display screen 1105. As shown, one or both of PMIC 1130 and/or RFIC 1125 may employ a die or device having any transistor structures and/or related characteristics discussed herein.

Functionally, PMIC 1130 may perform battery power regulation, DC-to-DC conversion, etc., and so has an input coupled to battery 1115 and with an output providing a current supply to other functional modules. In an embodiment, PMIC 1130 may perform high voltage operations. As further illustrated, in the exemplary embodiment, RFIC 1125 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 1150 or within a single IC (SoC) coupled to the package substrate of the packaged device 1150.

Figure 12:
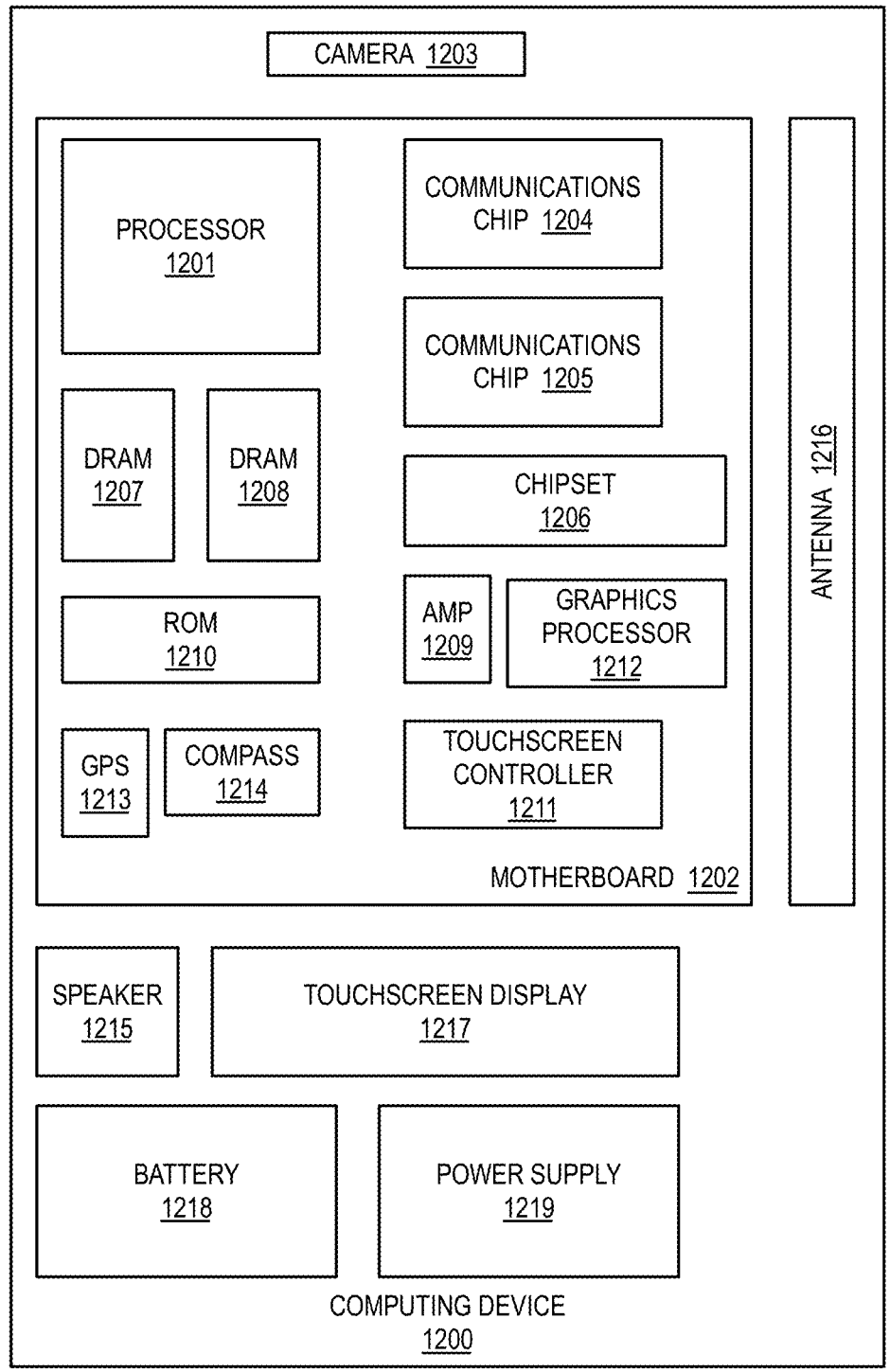
FIG. 12 is a functional block diagram of a computing device, all arranged in accordance with at least some implementations of the present disclosure.

FIG. 12 is a functional block diagram of a computing device 1200, arranged in accordance with at least some implementations of the present disclosure. Computing device 1200 may be found inside platform 1100, for example, and further includes a motherboard 1202 hosting a number of components, such as but not limited to a processor 1201 (e.g., an applications processor) and one or more communications chips 1204, 1205. Processor 1201 may be physically and/or electrically coupled to motherboard 1202. In some examples, processor 1201 includes an integrated circuit die packaged within the processor 1201. In general, the term "processor" may refer to any device or portion of a device that processes electronic data from registers and/or memory to transform that electronic data into other electronic data that may be stored in registers and/or memory. Any one or more device or component of computing device 1200 may include a die having a nonlinear lithographic seam, or any other structure with any related characteristics discussed herein.

In various examples, one or more communication chips 1204, 1205 may also be physically and/or electrically coupled to the motherboard 1202. In further implementations, communication chips 1204 may be part of processor 1201. Depending on its applications, computing device 1200 may include other components that may or may not be physically and electrically coupled to motherboard 1202. These other components may include, but are not limited to, volatile memory (e.g., DRAM) 1207, 1208, non-volatile memory (e.g., ROM) 1210, a graphics processor 1212, flash memory, global positioning system (GPS) device 1213, compass 1214, a chipset 1206, an antenna 1216, a power amplifier 1209, a touchscreen controller 1211, a touchscreen display 1217, a speaker 1215, a camera 1203, a battery 1218, and a power supply 1219, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1204, 1205 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1204, 1205 may implement any of a number of wireless standards or protocols, including but not limited to those described elsewhere herein. As discussed, computing device 1200 may include a plurality of communication chips 1204, 1205. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 1219 may convert a source power from a source voltage to one or more voltages employed by other devices of computing device 1200 (or mobile computing platform 1100). In some embodiments, power supply 1219 converts an AC power to DC power. In some embodiments, power supply 1219 converts an DC power to DC power at one or more different (lower) voltages. In some embodiments, multiple power supplies are staged to convert from AC to DC and then from DC at a higher voltage to DC at a lower voltage as specified by components of computing device 1200.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

In one or more first embodiments, a monolithic integrated circuit die comprises a plurality of first functional units in a first region of the IC die, and a plurality of second functional units in a second region of the IC die, wherein the first and second functional units comprise co-planar device layers and a plurality of co-planar metallization layers, and wherein the first and second regions are separated by a nonlinear lithographic seam therebetween, the nonlinear lithographic seam comprising non-functional structures in the co-planar device layers or at least one of the co-planar metallization layers.

In one or more second embodiments, further to the first embodiment, the nonlinear lithographic seam comprises a rectilinear lithographic seam.

In one or more third embodiments, further to the first or second embodiments, a subset of the first functional units and a subset of the second functional units are abutted against the nonlinear lithographic seam.

In one or more fourth embodiments, further to any of the first through third embodiments, the co-planar device layer or the co-planar metallization layer comprising the non-functional structures comprises active features of the first functional units in a first lithographic field of the IC die and active features of the second functional units in a second lithographic field of the IC die.

In one or more fifth embodiments, further to any of the first through fourth embodiments, the first and second lithographic fields overlap by a distance not less than a maximum distance across a maximum displacement between elbows of the nonlinear lithographic seam.

In one or more sixth embodiments, further to any of the first through fifth embodiments, the first lithographic field comprises a blank region corresponding to at least a first portion of the active features of the second functional units in the second lithographic field.

In one or more seventh embodiments, further to any of the first through sixth embodiments, the first and second lithographic fields comprises high numerical aperture extreme ultraviolet lithographic fields.

In one or more eighth embodiments, further to any of the first through seventh embodiments, a second co-planar metallization layer of the plurality of co-planar metallization layers comprises a third lithographic field comprising the areas of the first and second lithographic fields.

In one or more ninth embodiments, further to any of the first through eighth embodiments, the co-planar device layer or the co-planar metallization layer comprising the non-functional structures comprises active features of the first functional units and active features of the second functional units, and wherein a second co-planar metallization layer of the plurality of co-planar metallization layers comprises a metal line extending over the nonlinear lithographic seam and between one of the first functional units to one of the second functional units.

In one or more tenth embodiments, further to any of the first through ninth embodiments, the integrated circuit die further comprises a plurality of third functional units in a third region of the IC die, the third functional units comprising the co-planar device layer and co-planar metallization layers, wherein the second and third regions are separated by a second nonlinear lithographic seam therebetween.

In one or more eleventh embodiments, further to any of the first through tenth embodiments, a first subset of the first functional units, a second subset of the second functional units, and a portion of the nonlinear lithographic seam extending between the first and second subsets comprise a first unit of the IC die, wherein the first unit is repeated orthogonal to the portion of the nonlinear lithographic seam into the first and second regions of the IC die.

In one or more twelfth embodiments, further to any of the first through eleventh embodiments, the nonlinear lithographic seam comprises a seam width of not less than 10 microns.

In one or more thirteenth embodiments, further to any of the first through twelfth embodiments, the non-functional structures comprise lithographic registration marks and metrology structures.

In one or more fourteenth embodiments, a system comprises a power supply and an integrated circuit die coupled to the power supply, the integrated circuit die according to any of the first through thirteenth embodiments.

In one or more fifteenth embodiments, a system comprises a first die comprising memory circuitry, a second die comprising logic circuitry, the first or second die comprising first substantially rectangular functional units in a first region of the first or second die, second substantially rectangular functional units in a second region of the first or second die, the first and second functional units comprising a co-planar device layer and a plurality of co-planar metallization layers, and a rectilinear lithographic seam between the first and second functional units, the nonlinear lithographic seam comprising non-functional structures in the co-planar device layer or at least one of the co-planar metallization layers, wherein the rectilinear lithographic seam comprises a first elbow and a second elbow aligned with the first elbow, and wherein one of the first functional units is within the first elbow and one of the second functional units is within the second elbow, and a power supply coupled to the first or second die.

In one or more sixteenth embodiments, further to the fifteenth embodiment, the co-planar device layer or the co-planar metallization layer comprising the non-functional structures comprises active features of the first functional units in a first lithographic field of the IC die and active features of the second functional units in a second lithographic field of the IC die.

In one or more seventeenth embodiments, further to the fifteenth or sixteenth embodiments, the co-planar device layer or the co-planar metallization layer comprising the non-functional structures comprises active features of the first functional units and active features of the second functional units, and wherein a second co-planar metallization layer of the plurality of co-planar metallization layers comprises a metal line extending over the nonlinear lithographic seam and between one of the first functional units and one of the second functional units.

In one or more eighteenth embodiments, further to any of the fifteenth through seventeenth embodiments, the system further comprises a plurality of third functional units in a third region of the IC die, the third functional units comprising the co-planar device layer and co-planar metallization layers, wherein the second and third regions are separated by a second nonlinear lithographic seam therebetween.

In one or more nineteenth embodiments, further to any of the fifteenth through eighteenth embodiments, the non-functional structures comprise lithographic registration marks and metrology structures.

In one or more twentieth embodiments, a method comprises exposing a first lithographic field of a photoresist layer over a die, exposing a second lithographic field of the photoresist layer adjacent the first lithographic field, and forming a layer of one of device structures or metallization structures in first and second regions of the die using the exposed first and second lithographic fields of the photoresist layer, the first region comprising first rectangular functional units of the device structures or metallization structures and the second region comprising second rectangular functional units of the device structures or metallization structures, the layer further comprising a nonlinear lithographic seam between the first and second regions, the nonlinear lithographic seam comprising lithographic registration marks and metrology structures patterned in said exposing the first or second lithographic fields.

In one or more twenty-first embodiments, further to the twentieth embodiment, the first and second lithographic fields overlap by a distance not less than a maximum distance across the maximum displacement between elbows of the nonlinear lithographic seam.

In one or more twenty-second embodiments, further to the twentieth or twenty-first embodiments, the first rectangular lithographic field comprises a blank region corresponding to at least a first portion of the active features of the second functional units in the second lithographic field.

In one or more twenty-third embodiments, further to any of the twentieth through twenty-second embodiments, the method further comprises exposing a third lithographic field of the photoresist layer adjacent the second lithographic field, wherein said forming the layer comprises forming a second nonlinear lithographic seam between the second and third regions, said exposing the first, second, and third lithographic fields comprising a high numerical aperture extreme ultraviolet exposure.

In one or more twenty-fourth embodiments, further to any of the twentieth through twenty-third embodiments, the method further comprises exposing a third lithographic field of a second photoresist layer over the die, the third lithographic field comprising the areas of the first and second lithographic fields, and forming a metallization layer in first and second regions of the die using the exposed third lithographic field, wherein the metallization layer comprises a metal line extending over the nonlinear lithographic seam.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A monolithic integrated circuit (IC) die, comprising:
a plurality of first functional units in a first region of the IC die; and
a plurality of second functional units in a second region of the IC die, wherein the first and second functional units comprise a co-planar device layer and a plurality of co-planar metallization layers, wherein the first and second regions are separated by a nonlinear lithographic seam therebetween, the nonlinear lithographic seam comprising non-functional structures in the co-planar device layer or at least one of the co-planar metallization layers, and wherein the co-planar device layer or the co-planar metallization layer comprising the non-functional structures comprises active features of the first functional units in a first lithographic field of the IC die and active features of the second functional units in a second lithographic field of the IC die.

2. The IC die of claim 1, wherein the first and second lithographic fields overlap by a distance not less than a maximum distance across a maximum displacement between elbows of the nonlinear lithographic seam.

3. The IC die of claim 1, wherein the first lithographic field comprises a blank region corresponding to at least a first portion of the active features of the second functional units in the second lithographic field.

4. The IC die of claim 1, wherein the first and second lithographic fields comprises high numerical aperture extreme ultraviolet lithographic fields.

5. The IC die of claim 1, wherein a second co-planar metallization layer of the plurality of co-planar metallization layers comprises a third lithographic field comprising areas of the first and second lithographic fields.

6. An apparatus, comprising:
a first die comprising memory circuitry;
a second die comprising logic circuitry, the first die or the second die comprising the monolithic integrated circuit (IC) die of claim 1; and
a power supply coupled to the first die or the second die.

7. A monolithic integrated circuit (IC) die, comprising:
a plurality of first functional units in a first region of the IC die; and
a plurality of second functional units in a second region of the IC die, wherein the first and second functional units comprise a co-planar device layer and a plurality of co-planar metallization layers, wherein the first and second regions are separated by a nonlinear lithographic seam therebetween, the nonlinear lithographic seam comprising non-functional structures in the co-planar device layer or at least one of the co-planar metallization layers, wherein the co-planar device layer or the co-planar metallization layer comprising the non-functional structures comprises active features of the first functional units and active features of the second functional units, and wherein a second co-planar metallization layer of the plurality of co-planar metallization layers comprises a metal line extending over the nonlinear lithographic seam and between one of the first functional units to one of the second functional units.

8. The IC die of claim 7, wherein the nonlinear lithographic seam comprises a rectilinear lithographic seam.

9. The IC die of claim 8, wherein a subset of the first functional units and a subset of the second functional units are abutted against the nonlinear lithographic seam.

10. The IC die of claim 7, wherein the co-planar device layer or the co-planar metallization layer comprising the non-functional structures comprises active features of the first functional units in a first lithographic field of the IC die and active features of the second functional units in a second lithographic field of the IC die.

11. The IC die of claim 7, further comprising a plurality of third functional units in a third region of the IC die, the third functional units comprising the co-planar device layer and co-planar metallization layers, wherein the second and third regions are separated by a second nonlinear lithographic seam therebetween.

12. An apparatus, comprising:
a first die comprising memory circuitry;
a second die comprising logic circuitry, the first die or the second die comprising the monolithic integrated circuit (IC) die of claim 7; and
a power supply coupled to the first die or the second die.

13. A monolithic integrated circuit (IC) die, comprising:
a plurality of first functional units in a first region of the IC die;
a plurality of second functional units in a second region of the IC die, wherein the first and second functional units comprise a co-planar device layer and a plurality of co-planar metallization layers, and wherein the first and second regions are separated by a first nonlinear lithographic seam therebetween, the first nonlinear lithographic seam comprising non-functional structures in the co-planar device layer or at least one of the co-planar metallization layers; and
a plurality of third functional units in a third region of the IC die, the third functional units comprising the co-planar device layer and co-planar metallization layers, wherein the second and third regions are separated by a second nonlinear lithographic seam therebetween.

14. The IC die of claim 13, wherein a first subset of the first functional units, a second subset of the second functional units, and a portion of the first nonlinear lithographic seam extending between the first and second subsets comprise a first unit of the IC die, wherein the first unit is repeated orthogonal to the portion of the first nonlinear lithographic seam into the first and second regions of the IC die.

15. The IC die of claim 13, wherein the first nonlinear lithographic seam comprises a rectilinear lithographic seam.

16. The IC die of claim 15, wherein a subset of the first functional units and a subset of the second functional units are abutted against the first nonlinear lithographic seam.

17. The IC die of claim 13, wherein the co-planar device layer or the co-planar metallization layer comprising the non-functional structures comprises active features of the first functional units in a first lithographic field of the IC die and active features of the second functional units in a second lithographic field of the IC die.

18. An apparatus, comprising:
 a first die comprising memory circuitry;
 a second die comprising logic circuitry, the first die or the second die comprising the monolithic integrated circuit (IC) die of claim 13; and
 a power supply coupled to the first die or the second die.

19. A monolithic integrated circuit (IC) die, comprising:
 first substantially rectangular functional units in a first region of the IC die;
 second substantially rectangular functional units in a second region of the IC die, the first and second functional units comprising a co-planar device layer and a plurality of co-planar metallization layers; and
 a rectilinear lithographic seam between the first and second functional units, the rectilinear lithographic seam comprising non-functional structures in the co-planar device layer or at least one of the co-planar metallization layers, wherein the rectilinear lithographic seam comprises a first elbow and a second elbow aligned with the first elbow, and wherein one of the first functional units is within the first elbow and one of the second functional units is within the second elbow.

20. The IC die of claim 19, wherein the co-planar device layer or the co-planar metallization layer comprising the non-functional structures comprises active features of the first functional units in a first lithographic field of the IC die and active features of the second functional units in a second lithographic field of the IC die.

21. The IC die of claim 19, wherein the co-planar device layer or the co-planar metallization layer comprising the non-functional structures comprises active features of the first functional units and active features of the second functional units, and wherein a second co-planar metallization layer of the plurality of co-planar metallization layers comprises a metal line extending over the rectilinear lithographic seam and between one of the first functional units to one of the second functional units.

22. The IC die of claim 19, further comprising a plurality of third functional units in a third region of the IC die, the third functional units comprising the co-planar device layer and co-planar metallization layers, wherein the second and third regions are separated by a second nonlinear lithographic seam therebetween.

23. The IC die of claim 19, wherein the rectilinear lithographic seam comprises a seam width of not less than 10 microns.

24. An apparatus, comprising:
 a first die comprising memory circuitry;
 a second die comprising logic circuitry, the first die or the second die comprising the monolithic integrated circuit (IC) die of claim 19; and
 a power supply coupled to the first die or the second die.

* * * * *